United States Patent
Chang et al.

(10) Patent No.: US 8,004,098 B2
(45) Date of Patent: Aug. 23, 2011

(54) ALIGNMENT KEY, METHOD FOR FABRICATING THE ALIGNMENT KEY, AND METHOD FOR FABRICATING THIN FILM TRANSISTOR SUBSTRATE USING THE ALIGNMENT KEY

(75) Inventors: Youn Gyoung Chang, Gyeonggi-do (KR); Seung Hee Nam, Gyeonggi-do (KR); Nam Kook Kim, Gyeonggi-do (KR); Soon Sung Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/898,492

(22) Filed: Oct. 5, 2010

(65) Prior Publication Data
US 2011/0018147 A1      Jan. 27, 2011

Related U.S. Application Data

(62) Division of application No. 12/216,064, filed on Jun. 27, 2008, now Pat. No. 7,816,223.

(30) Foreign Application Priority Data

Jun. 27, 2007  (KR) .................. 10-2007-0063758

(51) Int. Cl.
  *H01L 23/544* (2006.01)
(52) U.S. Cl. ................. 257/797; 257/E23.179
(58) Field of Classification Search ............. 257/797, 257/E23.179
  See application file for complete search history.

(56) References Cited

U.S. PATENT DOCUMENTS

| | | | |
|---|---|---|---|
| 5,631,111 A * | 5/1997 | Niu et al. ............. | 430/7 |
| 7,569,153 B2 | 8/2009 | Baek et al. | |
| 2007/0298169 A1 | 12/2007 | Kim et al. | |
| 2009/0231820 A1* | 9/2009 | Tanaka ............. | 361/764 |

* cited by examiner

*Primary Examiner* — David S Blum
(74) *Attorney, Agent, or Firm* — Morgan, Lewis & Bockius LLP

(57) ABSTRACT

An alignment key, a method for fabricating the alignment key, and a method for fabricating a thin film transistor substrate using the alignment key are provided. The alignment key includes a base substrate, a first alignment key and a first mark portion of a second alignment key, which are formed on the base substrate using a printing roll, a dielectric that is formed on the base substrate to cover the first alignment key, and a second mark portion of the second alignment key, which is formed on the dielectric and at least partly overlaps the first mark portion of the second alignment key.

2 Claims, 8 Drawing Sheets

ALIGNMENT KEY, METHOD FOR FABRICATING THE ALIGNMENT KEY, AND METHOD FOR FABRICATING THIN FILM TRANSISTOR SUBSTRATE USING THE ALIGNMENT KEY

CROSS-REFERENCE TO RELATED APPLICATIONS

This is a divisional of U.S. patent application Ser. No., 12/216,064, now U.S. Pat. No. 7,816,223, filed Jun. 27, 2008, which is hereby incorporated by reference. The present application also claims the benefit of Korean Patent Application No. 10-2007-0063758, filed Jun. 27, 2007, which is hereby incorporated by reference.

BACKGROUND

The present disclosure relates to an alignment key, a method for fabricating the alignment key, and a method for fabricating a thin film transistor substrate using the alignment key.

A liquid crystal display (LCD) device includes two transparent substrates facing each other and a liquid crystal layer formed between the transparent substrates. When a voltage is applied to electrodes disposed on the respective substrates, liquid crystal molecules of the liquid crystal layer are realigned to display an image.

The LCD device is fabricated through a variety of processes such as a substrate cleaning process, a thin film patterning process, an alignment layer forming/rubbing process, a substrate combining/liquid crystal injection process, an inspection process, a repairing process, a mounting process, and the like.

The thin film patterning process is performed to form a variety of elements and driving lines on upper and lower transparent substrates. Describing a patterning process for the upper substrate (i.e., thin film transistor substrate), after a gate electrode is formed on a base substrate, a gate dielectric is formed on the base substrate. Subsequently, a semiconductor layer is formed on the gate dielectric, after which source and drain electrodes, a passivation layer, and a pixel electrode are sequentially formed.

When patterns for the gate electrode, semiconductor layer, source and drain electrodes, and pixel electrode are sequentially formed, an alignment key on the base substrate is used to accurately align the respective patterns.

However, when the alignment key is formed, a forming error of the alignment key occurs and thus the respective patterns formed on the substrate are designed to have predetermined margins. That is, if an allowable forming error of the alignment key is 0.5 μm, the design patterns of the gate electrode, semiconductor layer, source and drain electrodes, and pixel electrode have design margins of 1-1.5 μm that can cover the allowable forming error.

As the design margins of the gate electrode, semiconductor layer, source and drain electrodes, and pixel electrode are reduced, a liquid crystal cell is more finely and accurately formed. Therefore, it will be preferable that the allowable forming error of the alignment key is reduced.

However, some alignment key forming methods make it difficult to reduce the forming error of the alignment key. For instance, when the alignment key and the thin film pattern are formed through a printing process so as to simplify the process, as shown in FIG. 1, an actual forming location of the alignment key 4b may differ from a forming location of a designed mark pattern 4a of the alignment key.

That is, since a printing roll 8 moves on the mask during a resist pattern forming process, being applied with a predetermined pressure, the alignment key 4b is shifted. This causes the difference between the actual forming location of the alignment key 4b and the forming location of a designed mark pattern 4a of the alignment key.

When the alignment key is formed through the printing process, the actual alignment key may be misaligned with a designed pattern by up to 10 μm.

When the respective patterns are formed based on the alignment key, a forming error for each of the pattern occurs. The forming error of the patterns is gradually increased as it goes to patterns that are formed after the gate electrode, semiconductor layer, source and drain electrodes, and pixel electrode are formed.

Particularly, when there is a forming error between the data line and the gate electrode, this may cause a crosstalk. The crosstalk is caused by a parasitic capacitance difference by a deviation between the data line and the pixel electrode of the adjacent pixels.

Therefore, there is a need for a device that can reduce the forming error of the alignment key.

SUMMARY

Accordingly, the present invention is directed to a liquid crystal display device that substantially obviates one or more of the problems due to limitations and disadvantages of the related art.

Embodiments provide an alignment key that can reduce a forming error of patterns, a method for forming the alignment key, and a method for fabricating a thin film transistor (TFT) substrate using the alignment key.

Embodiments also provide an alignment key that can solve a crosstalk problem by reducing a forming error between a data line and a pixel electrode, a method for forming the alignment key, and a method for fabricating a thin film transistor (TFT) substrate using the alignment key.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE EMBODIMENTS

Reference will now be made in detail to the embodiments of the present disclosure, examples of which are illustrated in the accompanying drawings.

The following will describe an embodiment with reference to FIGS. 2A to 4.

In an embodiment, two alignment keys, i.e., first and second alignment keys, are provided. According to the embodiment, since two alignment keys are used, an alignment error between different patterns can be reduced during a process for forming the patterns.

The first and second alignment keys are not simultaneously formed. That is, the first alignment key is first formed and subsequently the second alignment key is formed based on the first alignment key, after which the pattern is formed based on the second alignment key.

A method for forming the first and second alignment keys of a TFT substrate, and a process for forming major patterns of the TFT will be described below with reference to the drawings.

FIGS. 2A to 2I are views illustrating a process for forming an alignment key and a TFT substrate according to an embodiment. The embodiment exemplarily describes a process for forming the alignment key in a resist printing process for forming a resist pattern on a substrate using a printing roll.

Figure 1:
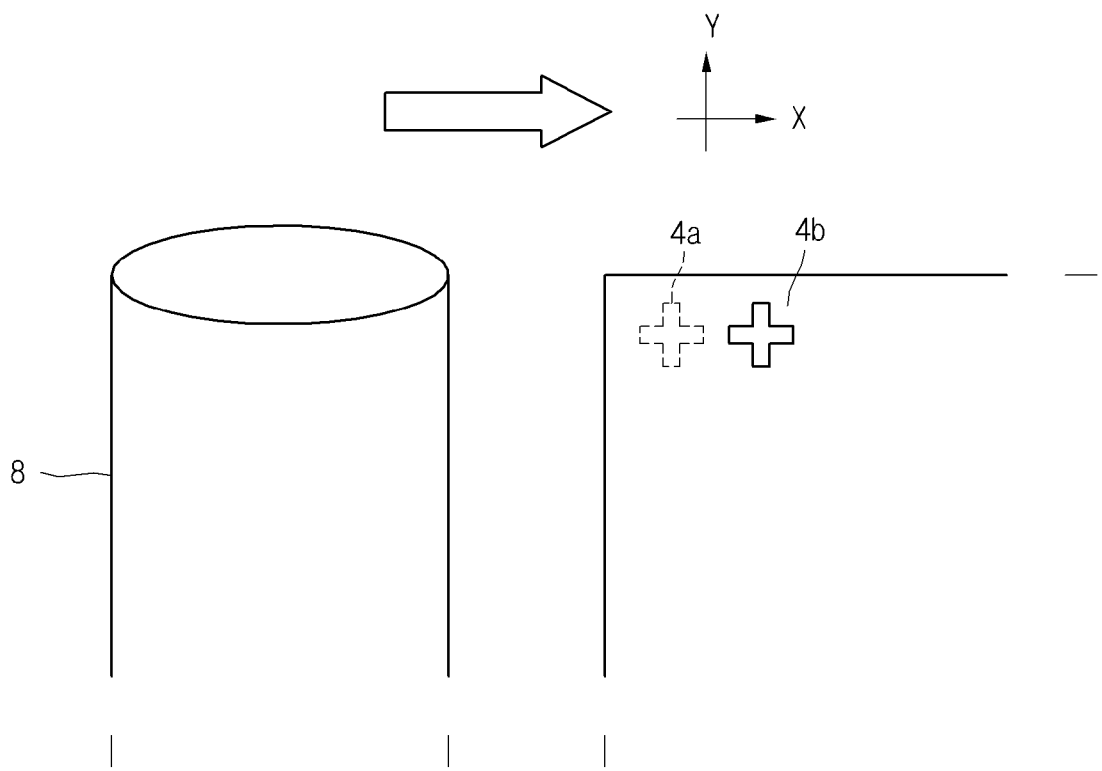
FIG. 1 is a schematic view illustrating shifting of an alignment key when he alignment key is formed through a printing process.
Figure 2A:
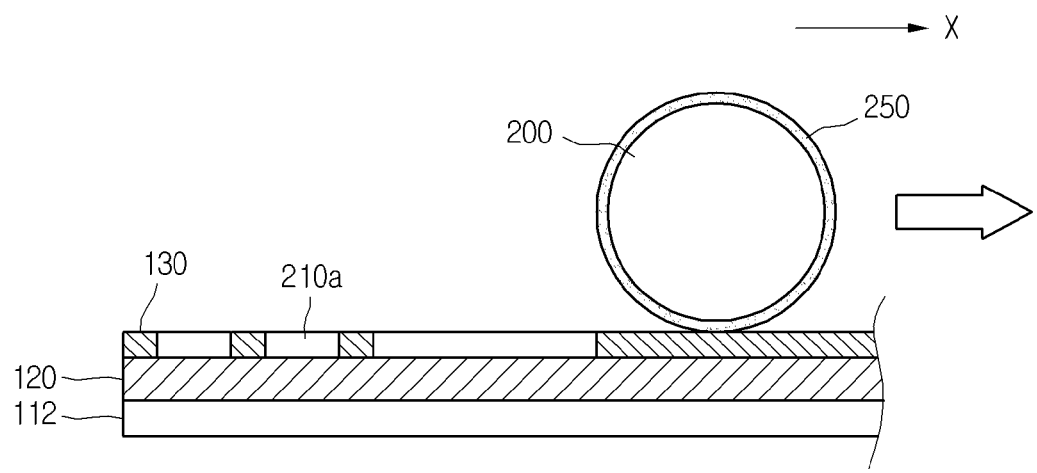
FIGS. 2A to 2I are views illustrating a process for forming an alignment key and a TFT substrate according to an embodiment.
Figure 2B:
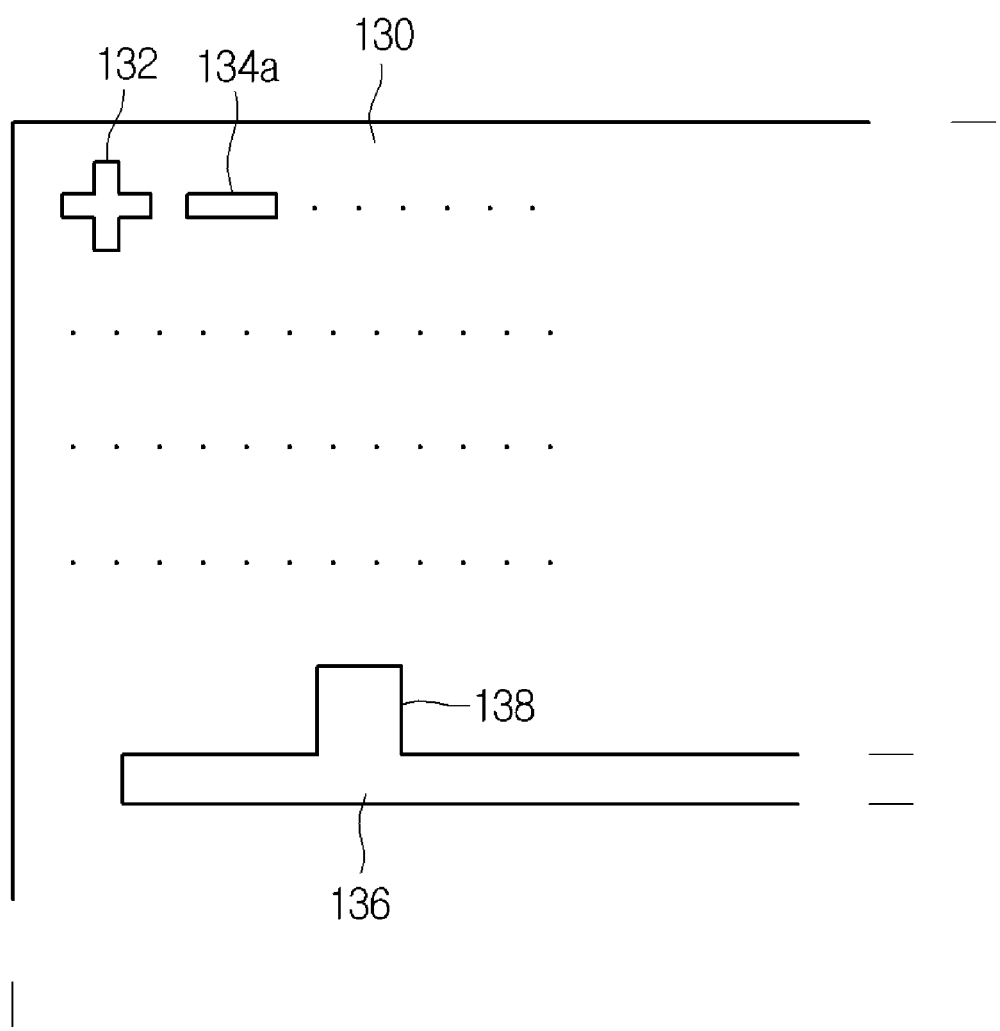

First, as shown in FIG. 2A, a first mask 130 is aligned on a metal layer 120 formed on a base substrate 112. The metal layer is formed of metal such as chrome (Cr), molybdenum (Mo), aluminum-based metal. As shown in FIG. 2B, the first mask 130 is provided with a plurality of openings defining a mask pattern 132 of the first alignment key, a first mark portion mask pattern 134a of the second alignment key, a gate line mask pattern 136, and a gate electrode mask pattern 138. In addition, the first mask 130 may include a first storage electrode mask pattern (not shown).

A first resist pattern 210a for forming a gate line by filling the openings of the first mask using a print roll 200 applied with a resist material 210 is formed on the gate metal layer 120.

Figure 2C:
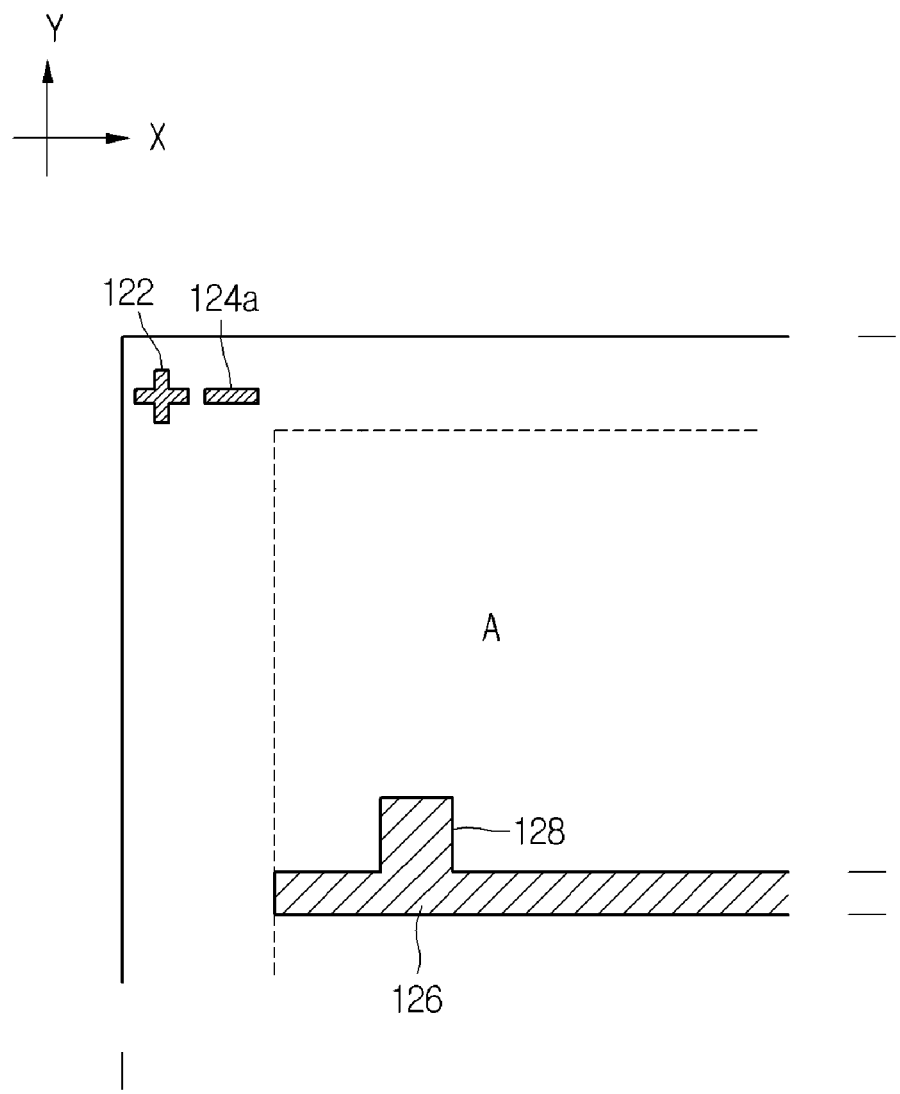

Next, the first mask 130 is removed from the gate metal layer 120. Subsequently, as shown in FIG. 2C, a gate electrode 128, a gate line 126, a first alignment key 122, and a first mark portion 124a of a second alignment key are formed on the base substrate 112. As can be noted from FIG. 2C, the first mark portion 124a of the second alignment key is elongated in an X-direction in which the printing roll 200 moves. In addition, the first alignment key 122 and the first mark portion 124a of the second alignment key are formed at a dummy region out of an active region A that is a display region of the TFT substrate.

Figure 2D:
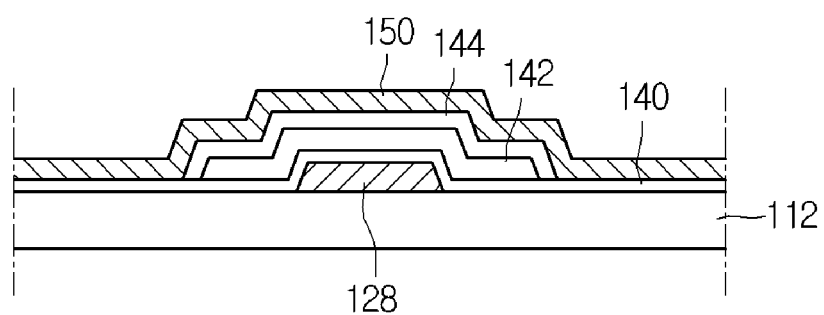

After the above, the first resist is removed from the gate metal layer 120 and, as shown in FIG. 2D, subsequently a gate dielectric 140 is formed. A semiconductor layer 142 and an ohmic contact layer 144 are formed on the gate dielectric 140. A data metal layer 150 is formed on the gate dielectric 140 to cover the semiconductor layer 142 and the ohmic contact layer 144.

At this point, the gate dielectric 140 may be formed by plasma enhanced chemical vapor deposition (PECVD). The data metal layer 150 may be formed of copper (Cu), chrome (Cr), molybdenum (Mo), titanium (Ti), tantalum (Ta), molybdenum alloy, or a combination thereof.

Figure 2E:
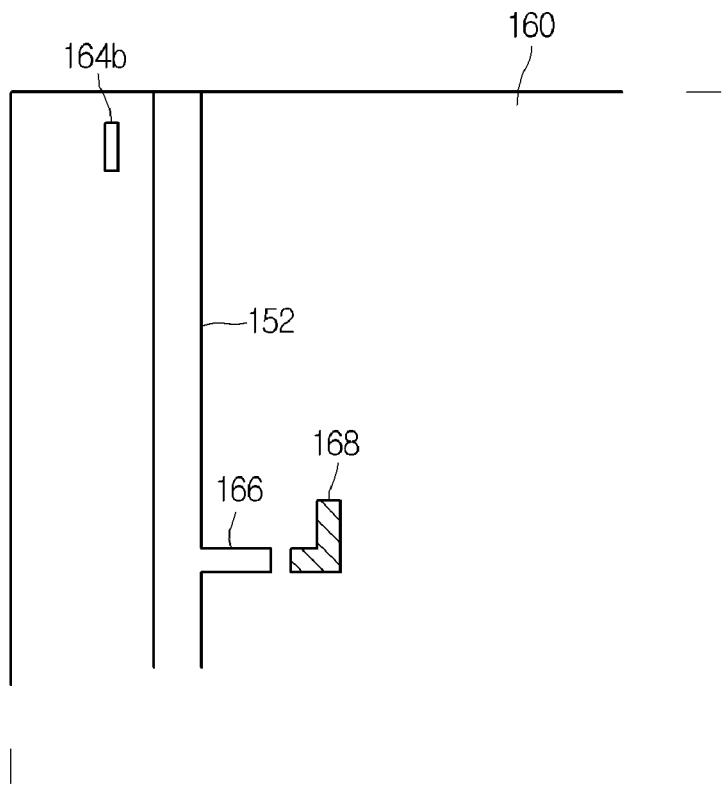
Figure 2E:
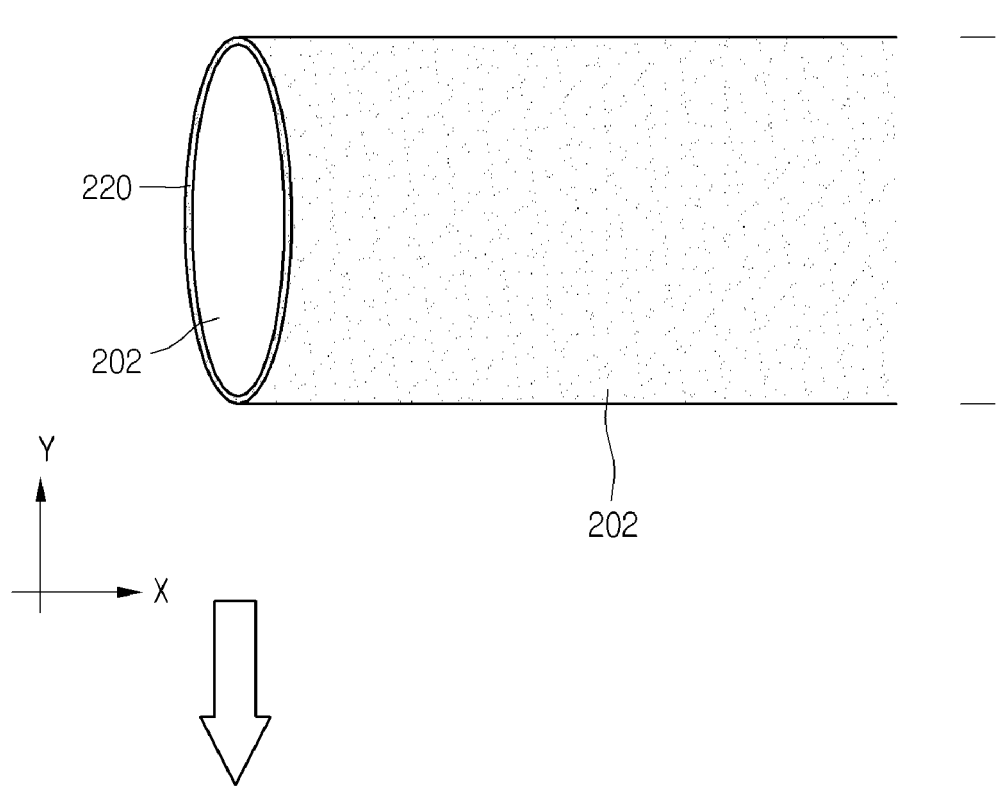
Figure 2F:
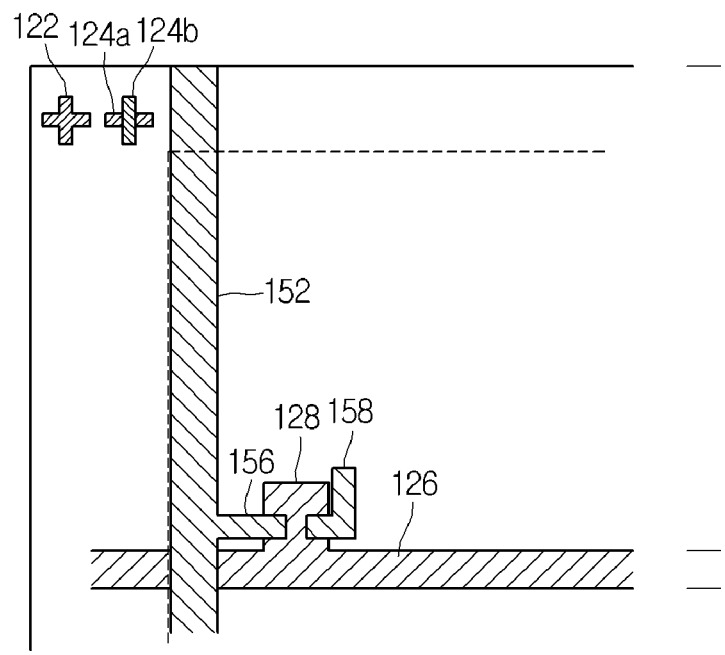

After forming the data metal layer 150, as shown in FIG. 2E, a second mask 160 provided with openings defining a data line mask pattern 152, source and drain electrode mask patterns 166 and 168, and a second mark portion mask pattern 164b of the second alignment key is aligned on the data metal layer 150.

Next, a second resist pattern is formed by filling the openings with a resist material 220 using a printing roll 202 applied with the resist material 220.

At this point, the second mark portion mask pattern 164b of the second alignment key is elongated in a direction that is different from the direction in which the first mark portion mask pattern 134a is elongated. That is, in the process of FIG. 2B, the printing roll 200 moves in an X-direction to form the mask including the first alignment key and the first mark portion of the second alignment key 2. In the process of FIG. 2D, the printing roll 202 moves in a Y-direction to form a second resist pattern including the second mark portion of the second alignment key. At this point, the Y-direction is perpendicular to the X-direction. In the coordinate, the Y-direction may be a +Y-axis or a −Y-axis.

After forming the second resist pattern as described above, the second mask 160 is removed from the data metal layer 150 and subsequently the data line 152, source and drain electrodes 156 and 158, and the second mark portion 124b of the second alignment key are formed. In addition, the ohmic contact layer 144 is separated.

Figure 2G:
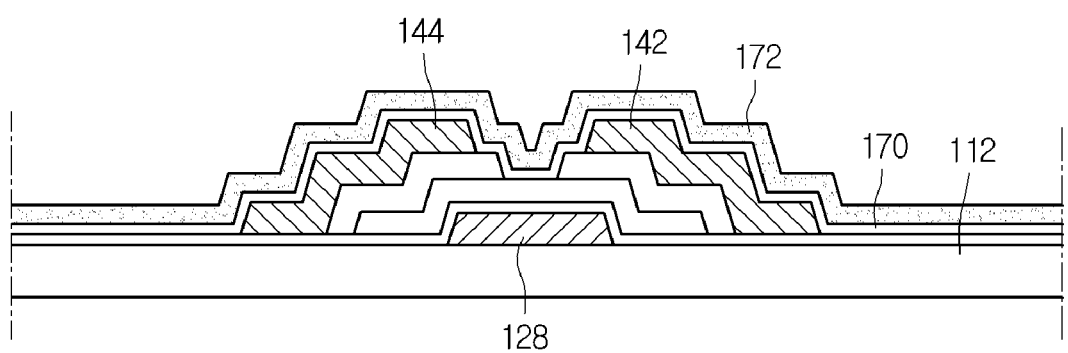

Next, after removing the second resist pattern is removed, as shown in FIG. 2G, a passivation layer 170 is formed, after which a transparent conductive layer 172 is deposited through a sputtering process. The transparent conductive layer 172 may be formed of ITO, TO, IZO, or ITZO.

Figure 2H:
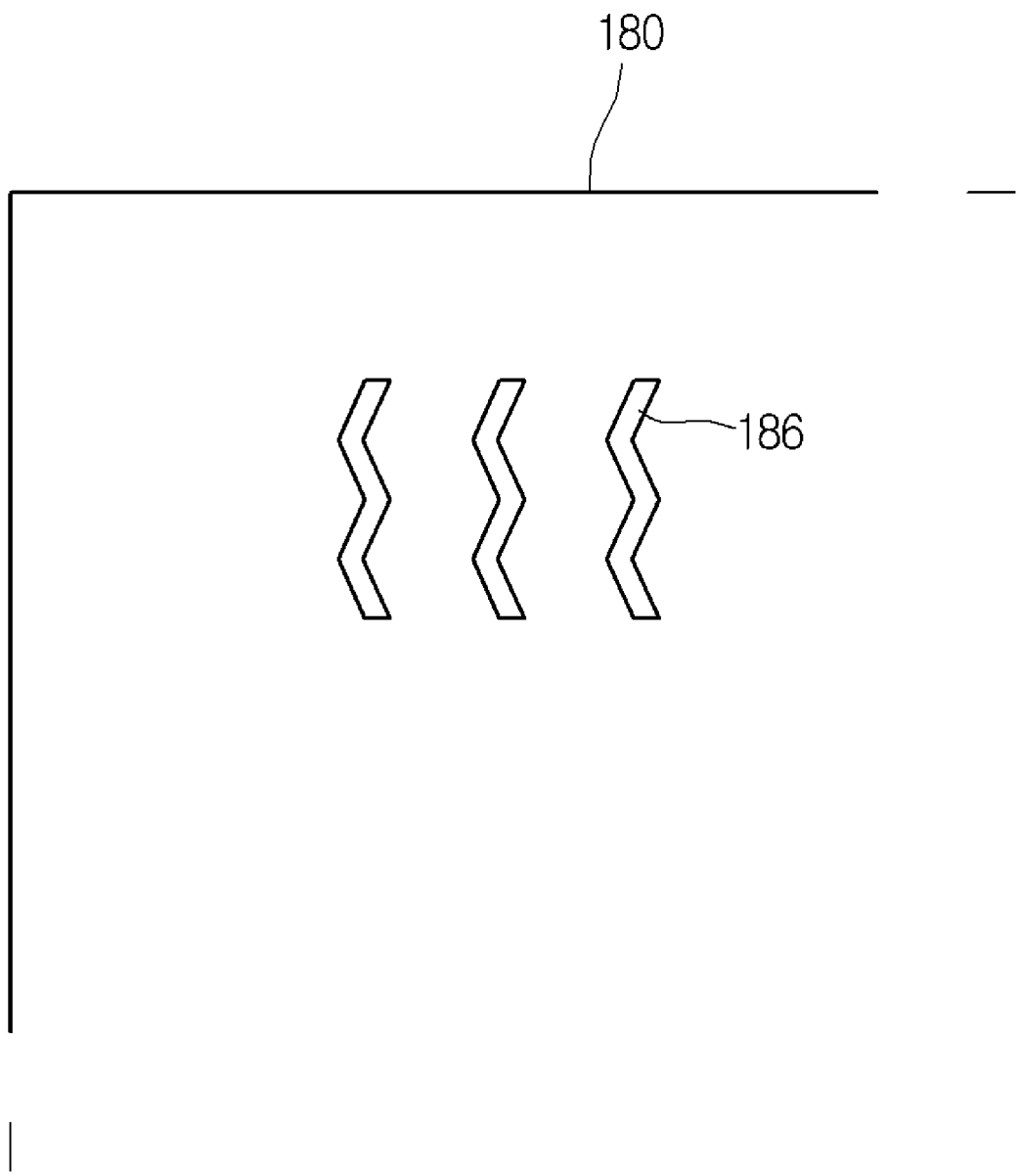

A resist material is applied on the transparent conductive layer 172 and subsequently a third mask 180 for forming a pixel electrode is formed as shown in FIG. 2H. The third mask 180 includes a pixel electrode mask pattern 186 and a second storage electrode (not shown).

At this point, the third mask is aligned based on the second alignment key 124.

Figure 2I:
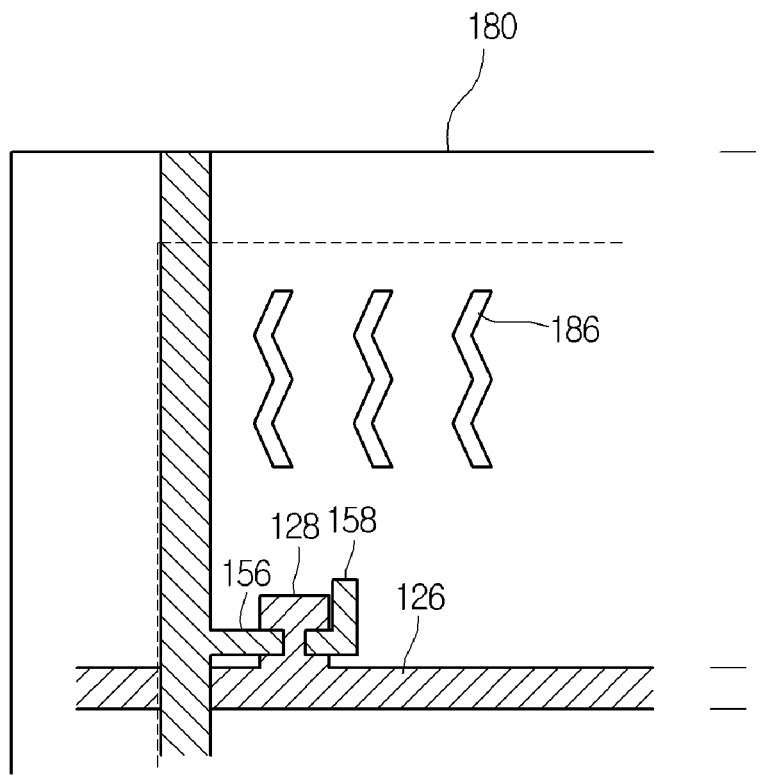

Next, through a photolithography process, a resist pattern corresponding to the third mask is formed and subsequently, through an etching process, a pixel electrode 196 is formed as shown in FIG. 2I.

The reason for using the photolithography process in the process for forming the resist pattern for forming the pixel electrode 196 is that it is more efficient to use the printing process as the shape of the pattern of the pixel electrode 196 is not simple straight line shape.

In the embodiment, only major patterns among the patterns of the TFT substrate are illustrated during the process for forming the first and second alignment keys. It will be obvious to form other patterns during forming of the major patterns.

When the pixel electrode is formed based on the second alignment key as described above, the pattern error of the pixel electrode can be reduced. This will be described hereinafter.

As in the related art, when the patterns are formed using only one alignment key, forming errors of the patterns are not uniform and a forming error between the pixel electrode and the data line increases.

Figure 3:
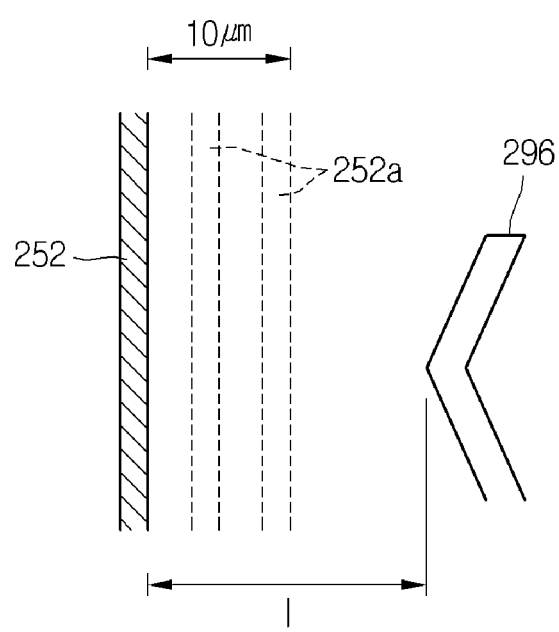
FIGS. 3 and 4 are views illustrating a reduction in a gap deviation between a data line and a pixel electrode on a TFT substrate according to an embodiment.

A forming error of the data line is about 10 μm in a process for forming the pattern using the printing process. That is, as shown in FIG. 3, the forming error of the actual pattern 252a from a designed pattern 252 is 10 μm or less.

In this state, a pattern error between the pixel electrode and the data line exists even when the pixel electrode is formed through the photolithography process. That is, when the pixel electrode is formed through the photolithograph process, there is very few forming error between the alignment key and the pixel electrode 296. However, an alignment error between the pixel electrode 296 and the data line 252a occurs due to the pattern error of the data line. For example, when a design value between the data line 252 and the pixel electrode 296 is l, an actual gap is determined by an error of the data line 252a from the design value.

Figure 4:
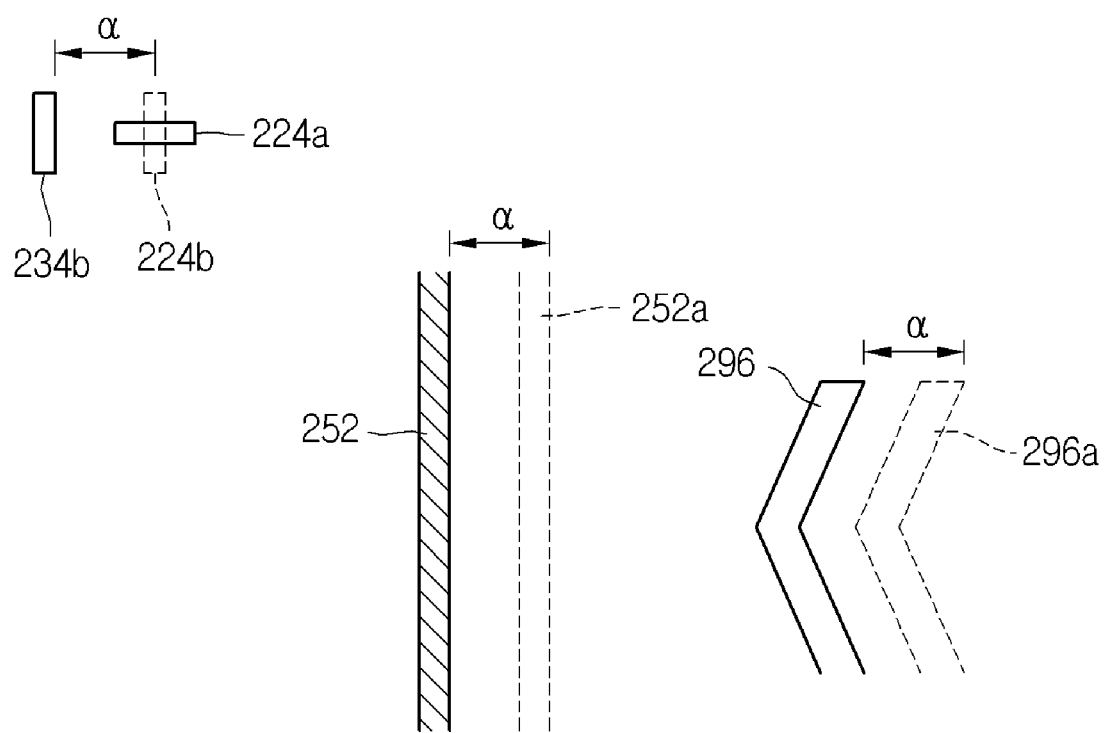

However, according to the process for patterning the TFT substrate using the alignment keys of the embodiment, the pattern error between the data line and the pixel electrode can be reduced. This is because that, as shown in FIG. 4, the pixel electrode is aligned based on the second alignment key 234b that is simultaneously formed with the data line 252a.

That is, when forming errors between design patterns and the second mask 224b and data line 252a of the second alignment key from an actual pattern are about "a" in the process for forming the second mask 224b and the data line 252a of the second alignment key, a forming error between the pixel electrode and the design pattern is also about "a" since the mask alignment for forming the pixel electrode is based on the second alignment key 224. That is, since a gap between the pixel electrode 296a and the data line 252a is set as the initial design value, an image quality problems caused by the crosstalk or flicker due to the deviation between the pixel electrode and the data line of the adjacent pixels can be improved.

As described above, according to the method for forming the TFT substrate using the alignment keys of the embodiment, the error occurring in the process for patterning the TFT substrate can be reduced.

Particularly, by forming the pixel electrode based on the second alignment key that is simultaneously formed with the data line, the error between the data line and the pixel electrode can be reduced and thus the crosstalk problem and the like can be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An alignment key comprising:
   a base substrate;
   a first alignment key and a first mark portion of a second alignment key, which are formed on the base substrate using a printing roll;
   a dielectric that is formed on the base substrate to cover the first alignment key; and
   a second mark portion of the second alignment key, which is formed on the dielectric and at least partly overlaps the first mark portion of the second alignment key.

2. The alignment key according to claim 1, wherein the first and second mark portions interest each other at a right angle.

* * * * *